United States Patent
Okumura

[19]

[11] Patent Number: 6,107,830
[45] Date of Patent: Aug. 22, 2000

[54] INTEGRATED CIRCUIT DEVICE INCLUDING CMOS TRI-STATE DRIVERS SUITABLE FOR POWERDOWN

[75] Inventor: Naoto Okumura, Tokyo, Japan

[73] Assignee: Mitsubishi Denki Kabushiki Kaisha, Tokyo, Japan

[21] Appl. No.: 09/178,494

[22] Filed: Oct. 26, 1998

[30] Foreign Application Priority Data

Jun. 9, 1998 [JP] Japan .................................. 10-160714

[51] Int. Cl.⁷ ............................................ H03K 19/0175
[52] U.S. Cl. .................. 326/58; 326/81; 326/80
[58] Field of Search ................................ 326/56, 57, 58, 326/82, 83, 80, 81

[56] References Cited

U.S. PATENT DOCUMENTS 4,963,766 10/1990 Lundberg .
5,546,021 8/1996 Bizuneh et al. ........................... 326/86

FOREIGN PATENT DOCUMENTS

6-343034 12/1994 Japan .
9-64718 5/1997 Japan .

Primary Examiner—Michael Tokar
Assistant Examiner—Anh Tran
Attorney, Agent, or Firm—Burns, Doane, Swecker & Mathis, LLP

[57] ABSTRACT

An integrated circuit device capable of effectively shutting off the power supply in a powerdown mode. The integrated circuit device is connected to a first (ground) power supply, a second power supply that continuously provides power, and a third power supply that halts power supply during the powerdown mode. It includes a controller and a CMOS tri-state driver consisting of a series connection of a P-channel MOS transistor and an N-channel MOS transistor. The P-channel MOS transistor has its source connected to the third power supply, its backgates connected to the second power supply and its gate connected to the controller. The N-channel MOS transistor has its source and backgate connected to the first power supply, its drain connected to the drain of the P-channel MOS transistor and its gate connected to the controller. The controller controls such that the gate of the P-channel MOS transistor is maintained at a high level and the gate of the N-channel MOS transistor is maintained at a low level during the powerdown. Thus, the backgate and the gate of the P-channel MOS transistor are both pulled-up to the high level, thereby keeping the output of the CMOS tri-state driver at a high-impedance state during the powerdown mode. This makes it possible to positively prevent a leakage current, which originates from another CMOS tri-state driver having a common output terminal with the present CMOS tri-state driver, from flowing into the P-channel MOS transistor.

3 Claims, 11 Drawing Sheets

| EN | D | Q |
|----|---|---|
| H  | H | H |
| H  | L | L |
| L  | H | Z |
| L  | L | Z |

INTEGRATED CIRCUIT DEVICE INCLUDING CMOS TRI-STATE DRIVERS SUITABLE FOR POWERDOWN

BACKGROUND OF THE INVENTION

1. Field of the Invention

The present invention relates to an integrated circuit device including a circuit for powering down by halting power supply.

2. Description of Related Art

Power saving of integrated circuit devices increases importance with the widespread of equipment such as mobile telephones, which supplies power to integrated circuits from a battery. To save consumption current of the integrated circuits, power supply to semiconductor devices can be suspended in accordance with the operating state of the equipment.

Figure 6:
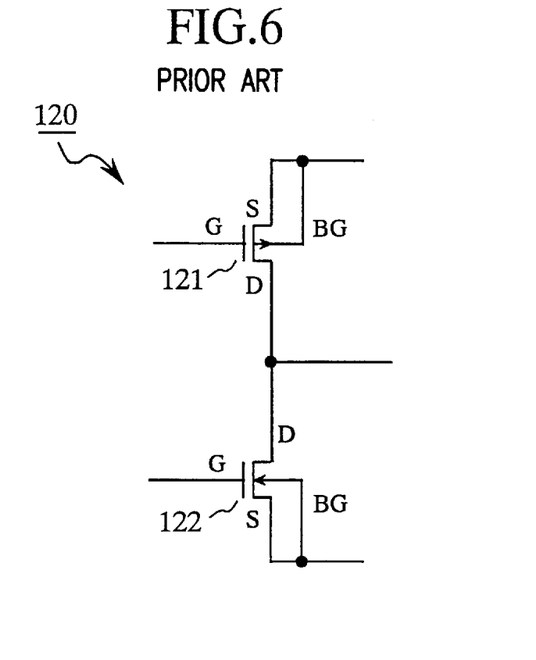
FIG. 6 is a circuit diagram showing a conventional CMOS tri-state driver.
Figure 7:
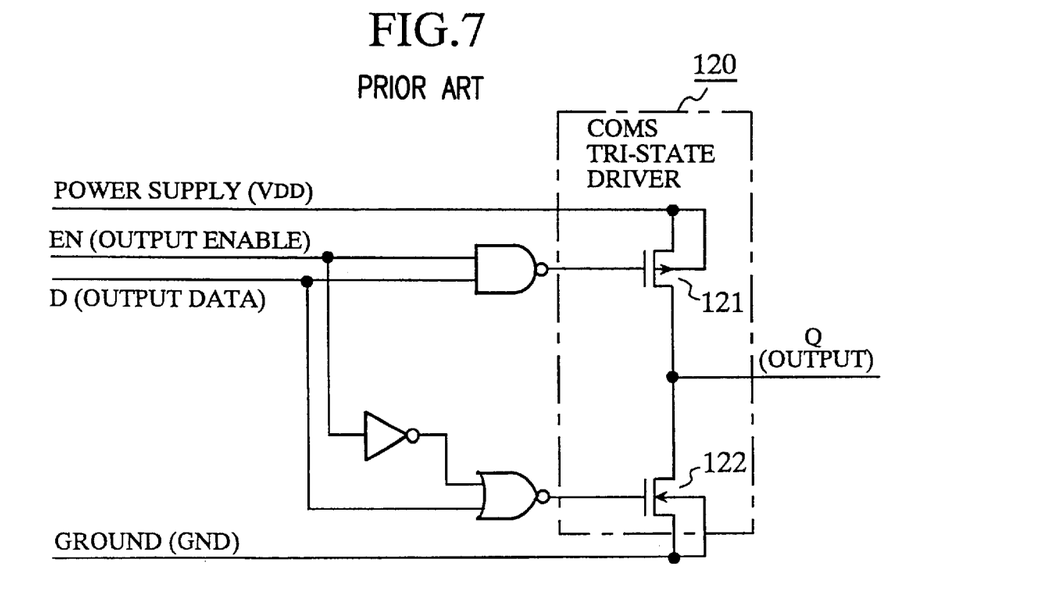
FIG. 7 is a circuit diagram showing a conventional output circuit.
Figure 8:
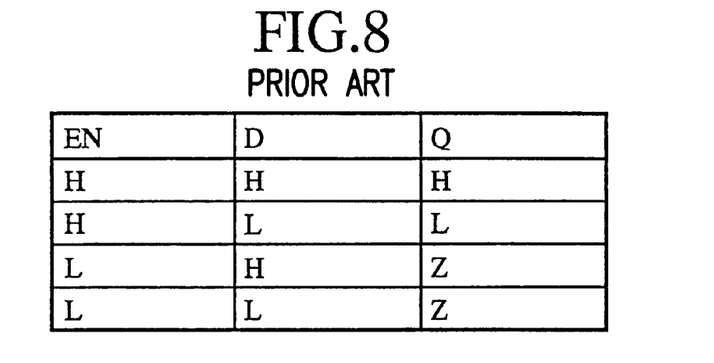
FIG. 8 is a truth table of the conventional output circuit of FIG. 7.

FIG. 6 shows a CMOS tri-state driver embedded in a conventional integrated circuit, and FIG. 7 shows an example of an output circuit using the CMOS tri-state driver of FIG. 6. In FIG. 6, the CMOS tri-state driver 120 consists of a P-channel MOS transistor 121 and an N-channel MOS transistor 122 which are connected in series. In FIG. 7, the output circuit produces an output signal Q that assumes one of the three logical levels "H" (high), "L" (low) and "Z" (high-impedance) in response to a drive control signal EN and an output data signal D. The power supply to all the logic gates is denoted by VDD. FIG. 8 is a truth table of the output circuit of FIG. 7.

Figure 9:
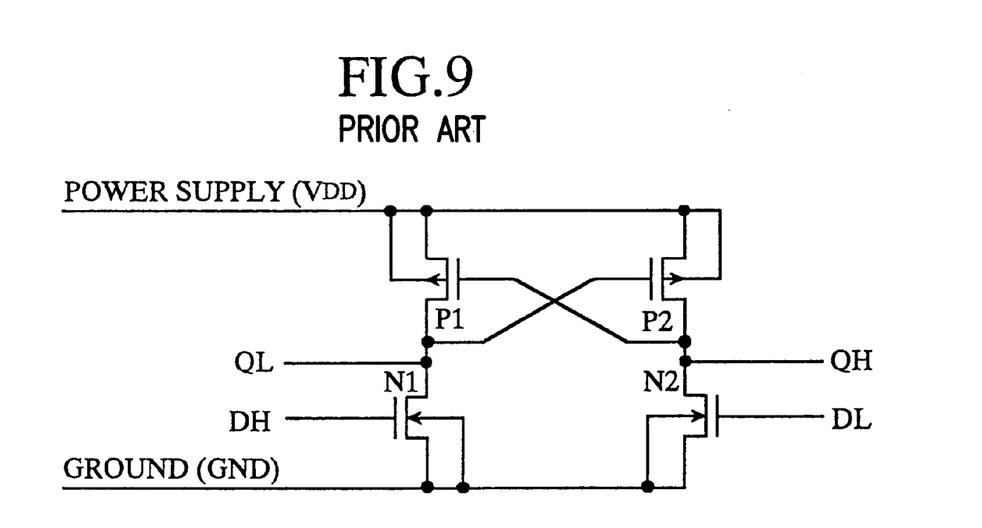
FIG. 9 is a circuit diagram showing a conventional CMOS level converter.

FIG. 9 shows a CMOS level converter for converting the voltage amplitude of an internal signal of a conventional integrated circuit. It is used for converting the voltage amplitude when the voltage amplitude of an input/output signal of the integrated circuit is greater than that of its internal signal. Using internal signals of a reduced voltage amplitude in the integrated circuit is effective to save its power. As a relevant prior art, a "Strong ARM processor" is known which is disclosed on page 121 of "HOT Chips 8-1996 Symposium Record".

In FIG. 9, DH and DL designate complementary inputs, and QH and QL designate complementary outputs. The "H" voltage of the input signals DH and DL is lower than the voltage supplied to P-channel MOS transistors P1 and P2 of the level converter. Circuit constants of the P-channel MOS transistor P1 and N-channel MOS transistor N1 are set in advance such that when the N-channel MOS transistor N1 is brought into conduction, the potential of the output signal QL is sufficiently dropped to such a level that brings the P-channel MOS transistor P2 into conduction.

Likewise, circuit constants of the P-channel MOS transistor P2 and N-channel MOS transistor N2 are set in advance such that when the N-channel MOS transistor N2 is brought into conduction, the potential of the output signal QH is sufficiently dropped to such a level that brings the P-channel MOS transistor P1 into conduction.

When the input signals DH and DL are placed at "H" and "L", respectively, the N-channel MOS transistor N1 is brought into conduction and the N-channel MOS transistor N2 is brought out of conduction. This drops the potential of the output signal QL, and brings the P-channel MOS transistor P2 into conduction, thereby raising the potential of the output signal QH, and bringing the P-channel MOS transistor P1 out of conduction. Thus, the output signal QH becomes "H", and the output signal QL becomes "L". In this case, the potential difference between the output signals QH and QL equals the potential difference between the source terminals of the P-channel MOS transistors and N-channel MOS transistors of the level converter. Thus, the output signals QH and QL can be obtained with a potential difference varying from that between the input signals DH and DL.

Figure 10:
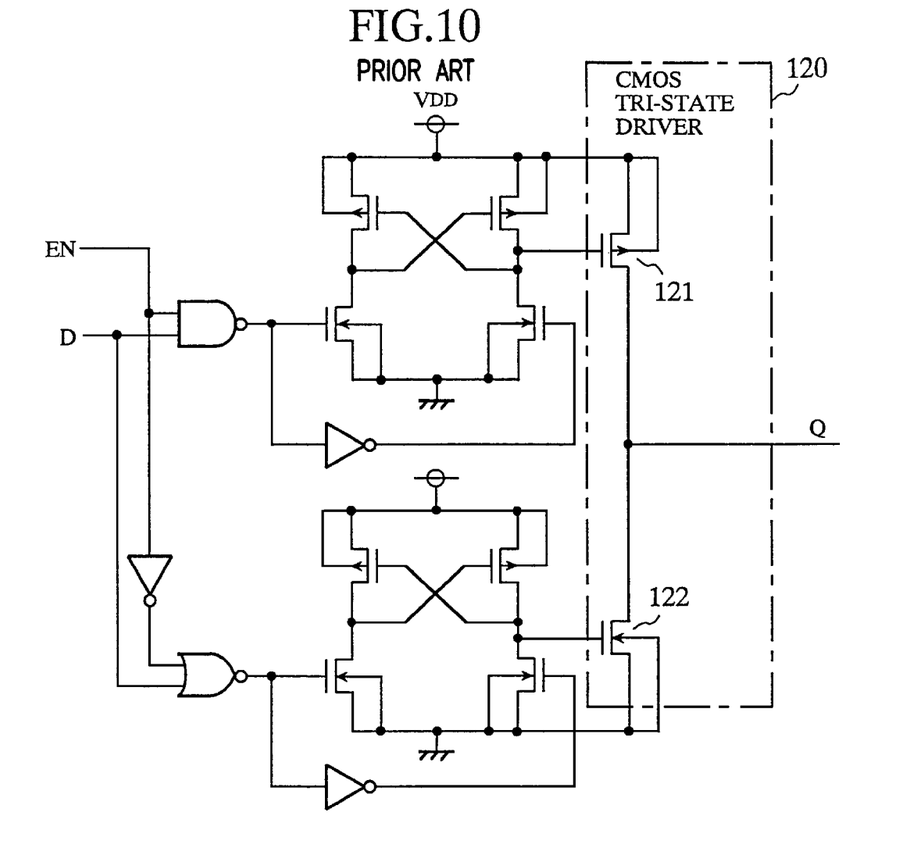
FIG. 10 is a circuit diagram showing a conventional output circuit using the CMOS level converters of FIG. 9.

FIG. 10 is an example of a conventional output circuit combining the CMOS tri-state driver of FIG. 6 with the CMOS level converter of FIG. 9. The output circuit operates just as that of FIG. 7 except that the voltage amplitude of the drive control signal EN and output data signal D differs from that of the output signal Q. The power to all the logic gates is supplied from an internal power supply with a voltage lower than VDD.

Figure 11:
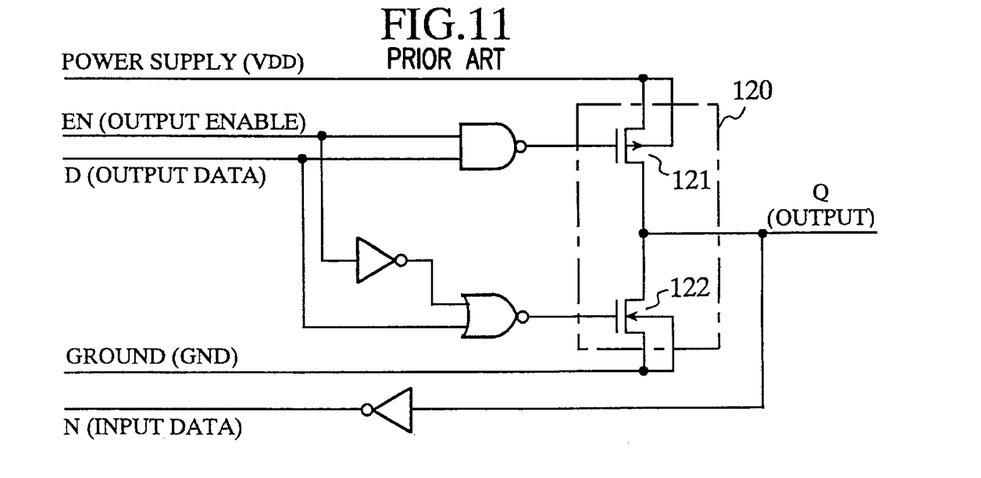
FIG. 11 is a circuit diagram showing an input/output circuit employing the conventional output circuit of FIG. 7.

FIG. 11 shows an input/output circuit using the output circuit of FIG. 7. As is well known, a plurality of such input/output circuits are usually connected together to each line of a bus, and are controlled such that only one of them drives the line of the bus at a time. The input/output circuit includes the CMOS tri-state driver 120 consisting of the P-channel MOS transistor 121 and the N-channel MOS transistor 122 which are connected in series, and a controller circuit for controlling the CMOS tri-state driver 120. The input/output circuit places, when the drive control signal EN is "L", its output signal Q at the high-impedance state "Z" regardless of the level of the output data signal D so that another input/output circuit connected to the same line can drive its output signal Q to "H" or "L". In addition, the input/output circuit transfers the level changes of the output signal Q as an input data signal N. The power supply to all the logic gates in the output/input circuit is VDD.

Figures 12, 13:
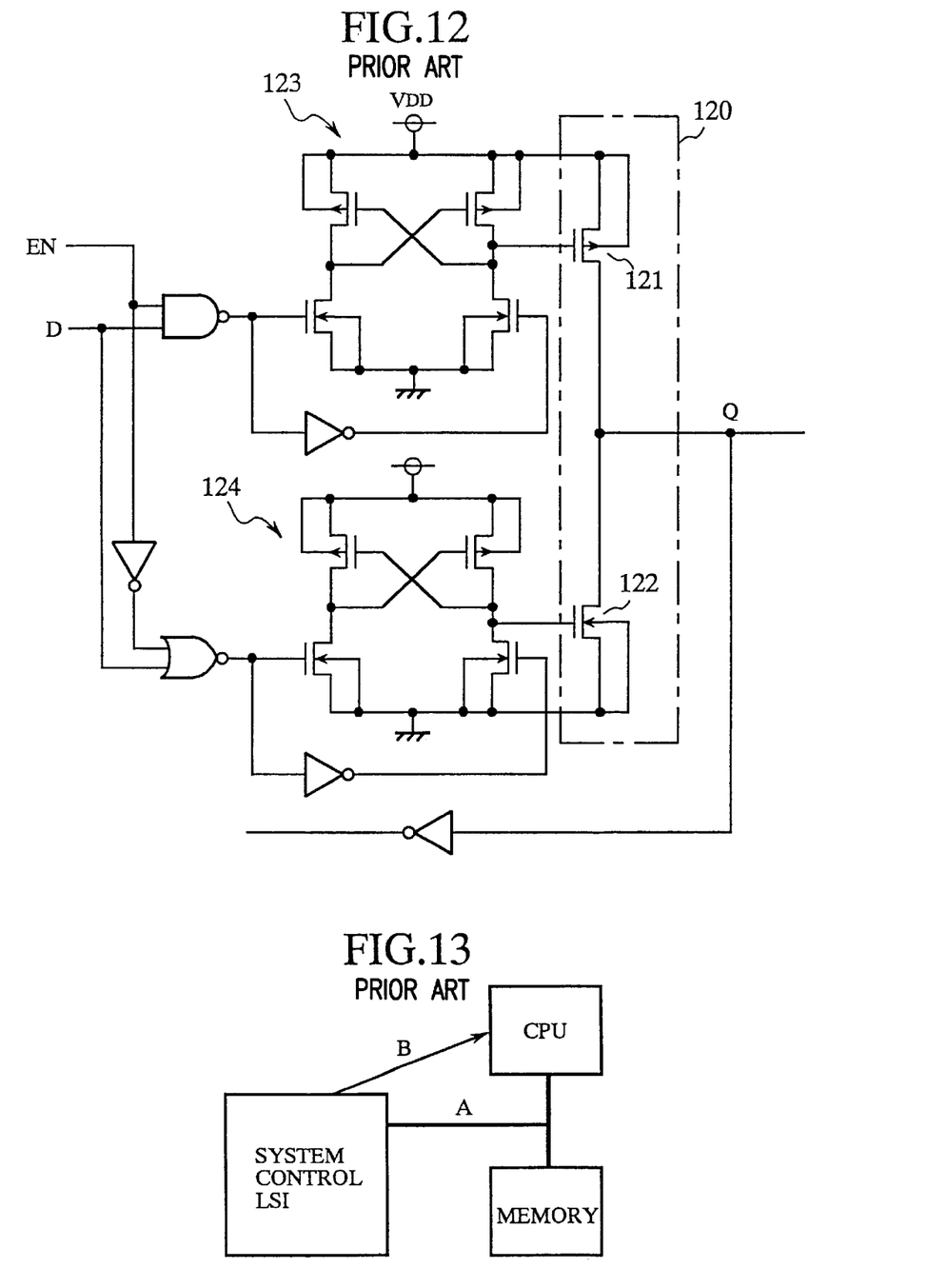
FIG. 12 is a circuit diagram showing an input/output circuit employing the conventional output circuit of FIG. 10.
FIG. 13 is a block diagram showing a conventional computer system.

FIG. 12 shows an input/output circuit employing the output circuit as shown in FIG. 9. The input/output circuit operates just as that of FIG. 11 except that the voltage amplitude of the drive control signal EN and output data signal D differs from that of the output signal Q. The power to all the logic gates is supplied from an internal power supply with a voltage lower than VDD.

FIG. 13 shows an example of a computer system configured by applying integrated circuits including the input/output circuits of FIG. 11. In FIG. 13, a CPU and a system control LSI share a memory and bus A, and employ the input/output circuits as shown in FIG. 11. When the data transfer between the CPU and memory is enabled by a control signal B from the system control LSI to the CPU, the output circuits of the system control LSI place the bus A at high-impedance state "Z" so that the CPU carries out the data transfer with the memory through the bus A. In contrast, when the data transfer between the CPU and memory is disabled by the control signal B from the system control LSI to the CPU, the output circuits of the CPU place the bus A at the high-impedance state "Z" so that the system control LSI carries out the data transfer with the memory through the bus A.

Figure 14:
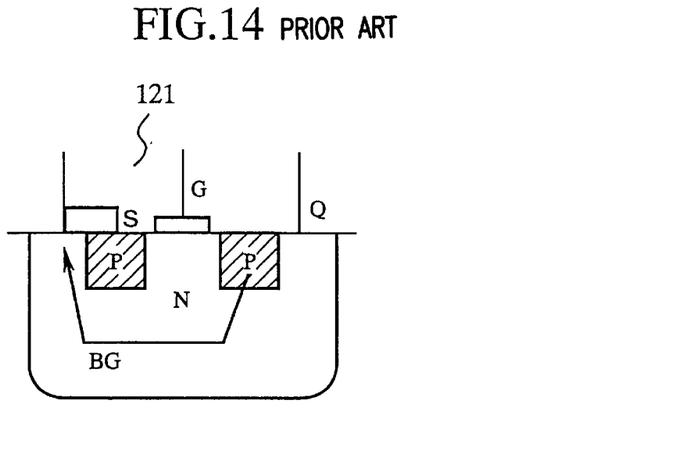
FIG. 14 is a cross-sectional view of a P-channel MOS transistor 121 connected to the output terminal of the CMOS tri-state driver.
Figure 15:
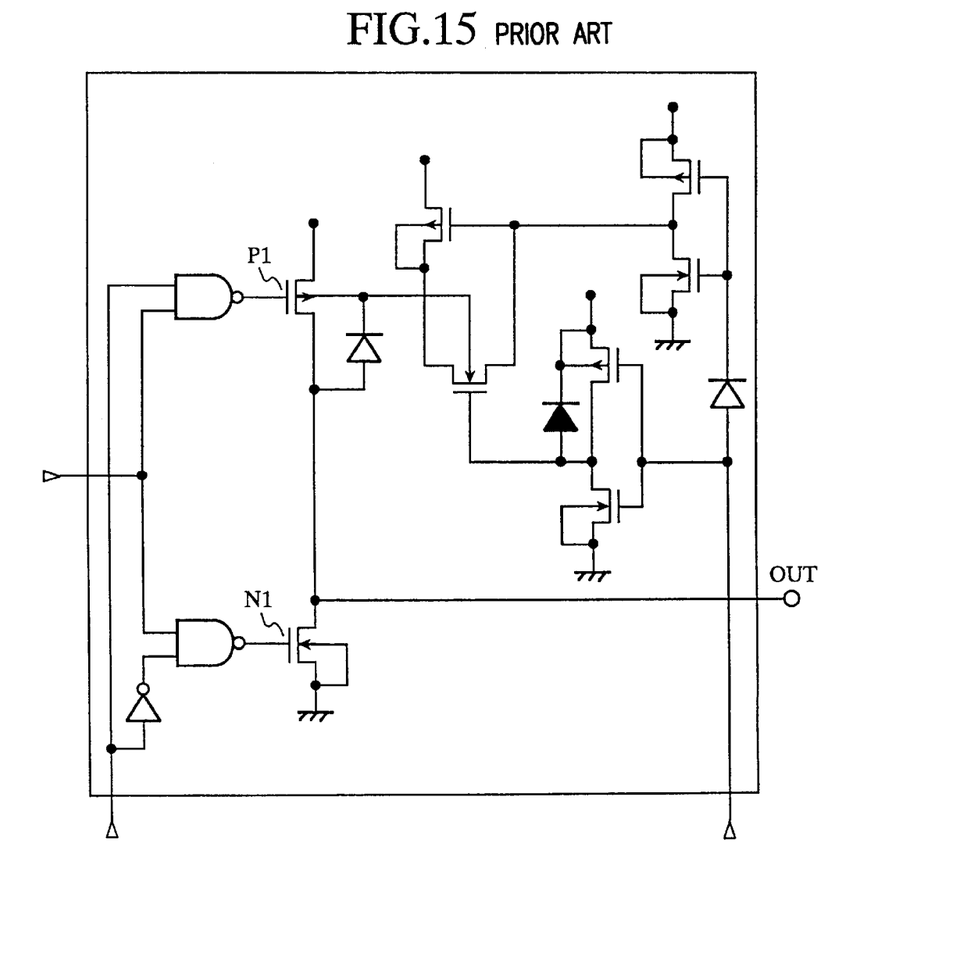
FIG. 15 is a circuit diagram showing a conventional CMOS tri-state driver disclosed in Japanese patent application laid-open No. 8-307238/1996.

In the computer system as shown in FIG. 13, the consumption power can be greatly reduced by shutting off the power supply to the CPU, when only the system control LSI and memory must be operated. The conventional computer system, however, has a problem of not being able to achieve sufficient power saving because of a drawback involved in the conventional CMOS tri-state drivers employed by the CPU. This will be described in more detail with reference to FIG. 14 illustrating the P-channel MOS transistor 121 of FIGS. 11 and 12 which has its source and backgate connected together to the power supply VDD and its drain connected to a line of the bus. Shutting off the power supply of the CPU (for powering down) will drop the potential of the source, backgate and drain of the P-channel MOS transistor 121 of the CMOS tri-state driver 120. If the system control LSI supplies the bus A with a signal of logic "H" in this case, a forward current will flow through the PN junction between the drain and the backgate of the P-channel MOS transistor 121 of the CMOS tri-state driver 120 as shown in FIG. 14. This is because the power supply to CPU is interrupted during the powerdown, and hence the source, which is connected to the power supply of the CPU, is placed at logic "L". Thus, electric charges are supplied from the output terminal of the system control LSI to the power supply terminal of the CPU, thereby hindering the power saving. In view of this, a CMOS tri-state driver disclosed in Japanese patent application laid-open No. 8-307238/1996, for example, has an additional circuit for supplying the P-channel MOS transistor with a backgate potential as shown in FIG. 15 to prevent the leakage current from flowing into the CPU even during the power shutdown. Although it can prevent the forward current to flow through the PN junction between the drain and the backgate of the P-channel MOS transistor as shown in FIG. 15, since the gate of the P-channel MOS transistor is not supplied with charges in the powerdown mode, a channel is formed in the P-channel MOS transistor, resulting in a leakage to the power supply terminal of the CPU through the channel. In addition, a problem arises of increasing the number of components per output driver.

In the computer system as shown in FIG. 13, the consumption power can also be greatly reduced by halting only the power supply to the internal circuits of the CPU, when it is necessary to operate only the system control LSI and memory but not the CPU. In this case, the output of the CMOS tri-state driver of FIG. 10 must be placed at "Z" by supplying "H" to the gate of the P-channel MOS transistor, and "L" to the gate of the N-channel MOS transistor. However, since the power supply is halted to the internal circuit of the CPU which delivers the complementary signals to the pair of the input terminals of the CMOS level converters of FIG. 10, the gate of the P-channel MOS transistor 121 is not supplied with the "H" voltage, making it impossible to prevent the leakage current from flowing through the channel to the power supply terminal of the CPU.

Figure 16:
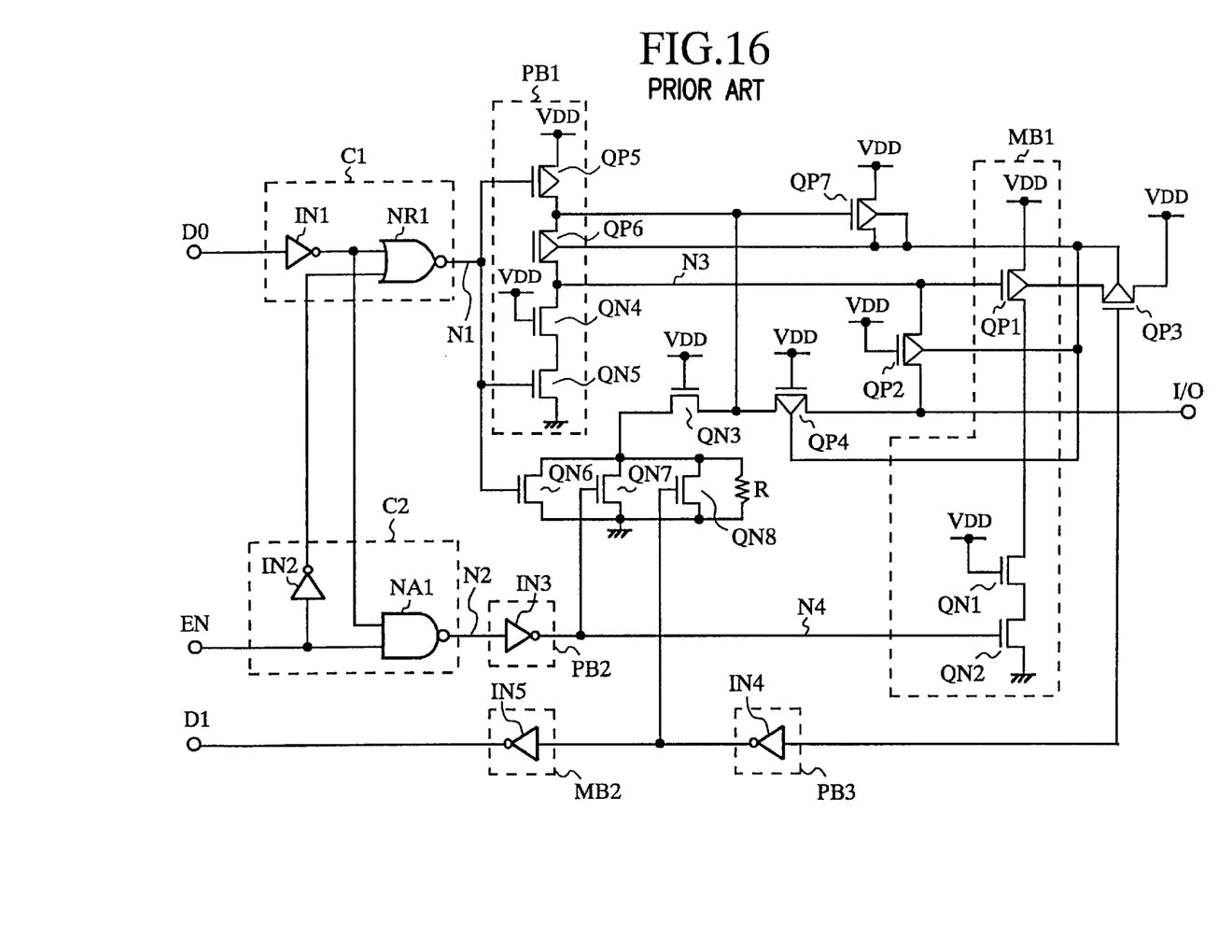
FIG. 16 is a circuit diagram showing a conventional CMOS tri-state driver disclosed in Japanese patent application laid-open No. 9-64718/1997.
Figure 17:
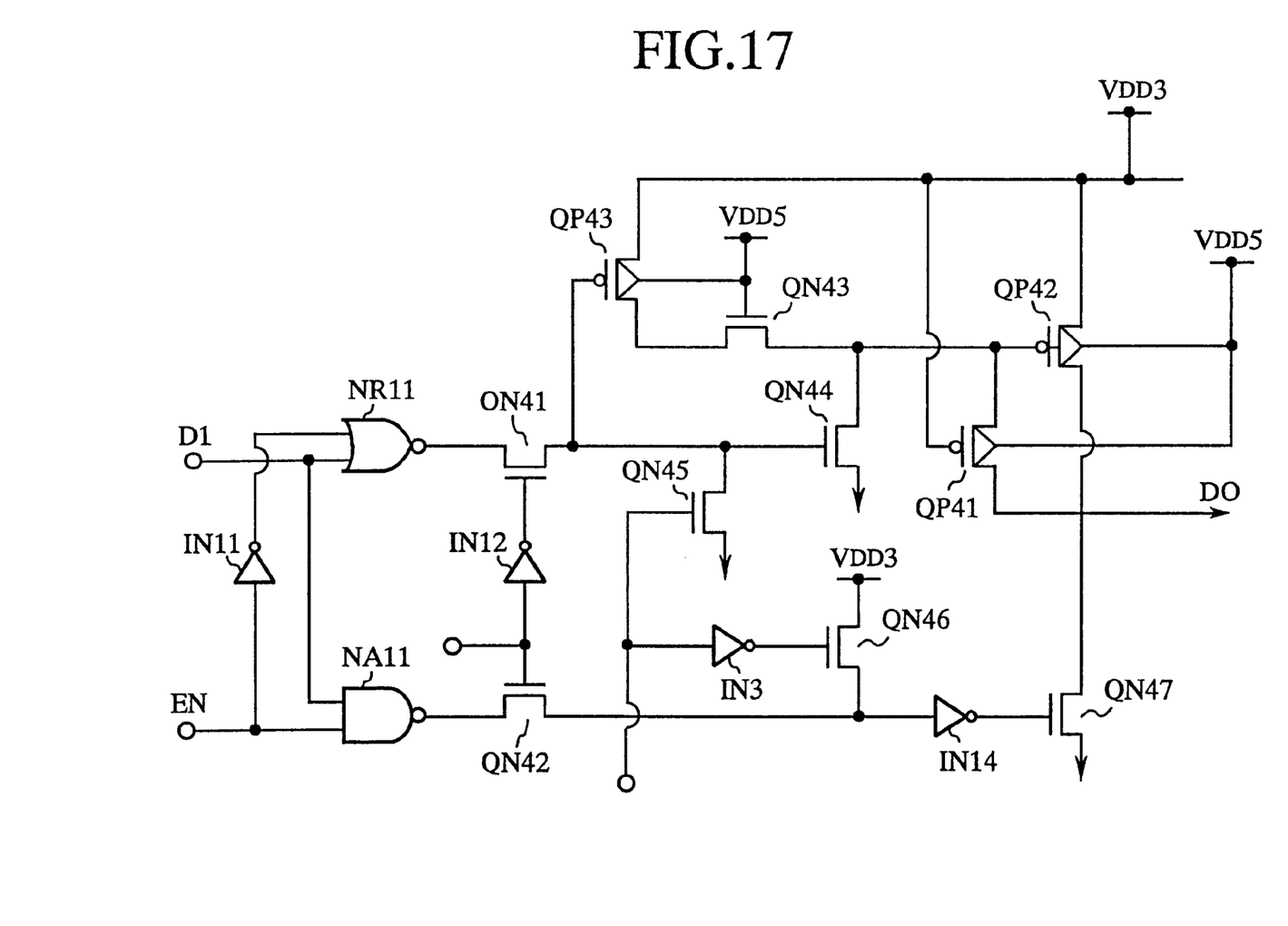
FIG. 17 is a circuit diagram showing a conventional CMOS tri-state driver disclosed in U.S. Pat. No. 4,963,766.

FIG. 16 shows a CMOS tri-state driver disclosed in Japanese patent application laid-open No. 9-64718/1997, and FIG. 17 shows a CMOS tri-state driver disclosed in U.S. Pat. No. 4,963,766. To avoid leakage due to a high voltage applied to the output terminal of the CMOS tri-state driver from the output terminal of another driver, the CMOS tri-state driver not only supplies a high voltage to the backgate of the P-channel MOS transistor QP1 or QP42 of FIGS. 16 and 17, but also includes a circuit for raising, through the P-channel MOS transistor QP2 or QP41, the gate voltage of the P-channel MOS transistor QP1 or QP42 in response to the high voltage applied to the output terminal to bring the P-channel MOS transistor QP1 or QP42 out of conduction. Each of the CMOS tri-state drivers, however, has a problem in that the gate of the P-channel MOS transistor QP1 or QP42 is supplied with electric charges through the P-channel MOS transistor QP2 or QP41 connected across the output terminal and the gate, and that this provides a delay which causes a transient leakage current to flow when the voltage applied to the output terminal sharply rises.

SUMMARY OF THE INVENTION

The present invention is implemented to solve the foregoing problems. It is therefore an object of the present invention to provide an integrated circuit device capable of effectively shutting off the power supply in the powerdown mode by eliminating the leakage.

According to a first aspect of the present invention, there is provided an integrated circuit device comprising:

a first power supply terminal to which a first fixed potential is supplied; a second power supply terminal to which a second fixed potential is supplied; a third power supply terminal to which a third fixed potential that can be powered down is supplied; an output terminal; a first conductivity type MOS transistor having its source connected to the third power supply terminal, its backgate connected to the second power supply terminal, and its drain connected to the output terminal, the source and backgate being electrically isolated; a second conductivity type MOS transistor having its drain connected to the output terminal, and its backgate and source connected to the first power supply terminal; a potential difference detector connected to the second power supply terminal and the third power supply terminal for detecting a potential difference between them; and a gate potential controller connected to the potential difference detector for controlling a potential of the gate of the first conductivity type MOS transistor in response to an output of the potential difference detector.

Here, the gate potential controller may control a potential of a gate of the second conductivity type MOS transistor in response to the output of the potential difference detector.

According to a second aspect of the present invention, there is provided an integrated circuit device comprising:

a first power supply terminal to which a first fixed potential is supplied; a second power supply terminal to which a second fixed potential is supplied; a third power supply terminal to which a third fixed potential that can be powered down is supplied; an output terminal; a first conductivity type MOS transistor having its source and backgate connected to the second power supply terminal, and its drain connected to the output terminal; a second conductivity type MOS transistor having its drain connected to the output terminal, and its backgate and source connected to the first power supply terminal; a potential difference detector connected to the second power supply terminal and the third power supply terminal for detecting a potential difference between them; and a CMOS level converter for converting outputs of the potential difference detector, and for supplying a converted signal to at least one of a gate of the first conductivity type MOS transistor and a gate of the second conductivity type MOS transistor.

Here, the CMOS level converter may supply, when the potential difference detector detects the potential difference between the second power supply terminal and the third power supply terminal, the gate of the first conductivity type MOS transistor with a potential equal to the potential of the second power supply terminal, and the gate of the second conductivity type MOS transistor with a potential equal to the potential of the first power supply terminal.

The CMOS level converter may comprises: a first power supply terminal to which a first fixed potential is supplied; a second power supply terminal to which a second fixed potential is supplied; a first data input terminal; a second data input terminal; a first output terminal; a second output terminal; a first mode control input terminal; a second mode control input terminal; a first first conductivity type MOS transistor having its source connected to the second power supply terminal, its drain connected to the first output terminal, and its gate connected to the first mode control input terminal; a second first conductivity type MOS transistor having its source connected to the second power supply terminal; its drain connected to the first output terminal, and its gate connected to the second output terminal; a third first conductivity type MOS transistor having its source connected to the second power supply terminal, its drain connected to the second output terminal and its gate connected to the first output terminal; a first second conductivity type MOS transistor having its drain connected to the first output terminal, and its gate connected to the first mode control input terminal; a second second conductivity type MOS transistor having its source connected to the first power supply terminal, its drain connected to a source of the first second conductivity type MOS transistor, and its gate connected to the first data input terminal; a third second conductivity type MOS transistor having its source connected to the first power supply terminal, its drain connected to the second output terminal, and its gate connected to the second mode control input terminal; and a fourth second conductivity type MOS transistor having its source connected to the first power supply terminal, its drain connected to the second output terminal, and its gate connected to the second data input terminal, wherein the first mode control input terminal and the second mode control input terminal may be connected to the potential difference detector, and the first output terminal may be connected to the gate of the first conductivity type MOS transistor.

According to a third aspect of the present invention, there is provided an integrated circuit device comprising: a first power supply terminal to which a first fixed potential is supplied; a second power supply terminal to which a second fixed potential is supplied; a tri-state driver including a first conductivity type MOS transistor that has a source and a backgate which are isolated from each other and has the backgate connected to the second power supply terminal, and a second conductivity type MOS transistor that has its drain connected to a drain of the first conductivity type MOS transistor and its source connected to the first power supply terminal; a switching circuit for connecting or disconnecting the source of the first conductivity type MOS transistor with the second power supply terminal; a gate potential controller for controlling a potential of a gate of the first conductivity type MOS transistor; and a power supply controller for controlling the switching circuit and the gate potential controller, wherein the integrated circuit device is partitioned into a first block including the tri-state driver, and a second block including the power supply controller, and wherein the switching circuit disconnects, when the power supply controller powers down the first block, the source of the first conductivity type MOS transistor from the second power supply terminal, and the gate potential controller supplies the gate of the second conductivity type MOS transistor with a potential equal to the potential of the second power supply terminal.

According to a fourth aspect of the present invention, there is provided a CMOS level converter for converting an amplitude potential of a signal, the CMOS level converter comprising: a first power supply terminal to which a first fixed potential is supplied; a second power supply terminal to which a second fixed potential is supplied; a first data input terminal; a second data input terminal; a first output terminal; a second output terminal; a first mode control input terminal; a second mode control input terminal; a first first conductivity type MOS transistor having its source connected to the second power supply terminal, its drain connected to the first output terminal, and its gate connected to the first mode control input terminal; a second first conductivity type MOS transistor having its source connected to the second power supply terminal; its drain connected to the first output terminal, and its gate connected to the second output terminal; a third first conductivity type MOS transistor having its source connected to the second power supply terminal, its drain connected to the second output terminal and its gate connected to the first output terminal; a first second conductivity type MOS transistor having its drain connected to the first output terminal, and its gate connected to the first mode control input terminal; a second second conductivity type MOS transistor having its source connected to the first power supply terminal, its drain connected to a source of the first second conductivity type MOS transistor, and its gate connected to the first data input terminal; a third second conductivity type MOS transistor having its source connected to the first power supply terminal, its drain connected to the second output terminal, and its gate connected to the second mode control input terminal; and a fourth second conductivity type MOS transistor having its source connected to the first power supply terminal, its drain connected to the second output terminal, and its gate connected to the second data input terminal.

Here, a potential of a signal supplied to the first data input terminal and the second data input terminal may differ from a potential difference between the first power supply terminal and the second-power supply terminal, and a potential of a signal supplied to the first mode control input terminal and the second mode control input terminal may equal the potential difference between the first power supply terminal and the second power supply terminal.

DETAILED DESCRIPTION OF THE PREFERRED EMBODIMENTS

The invention will now be described with reference to the accompanying drawings.

EMBODIMENT 1

Figure 1:
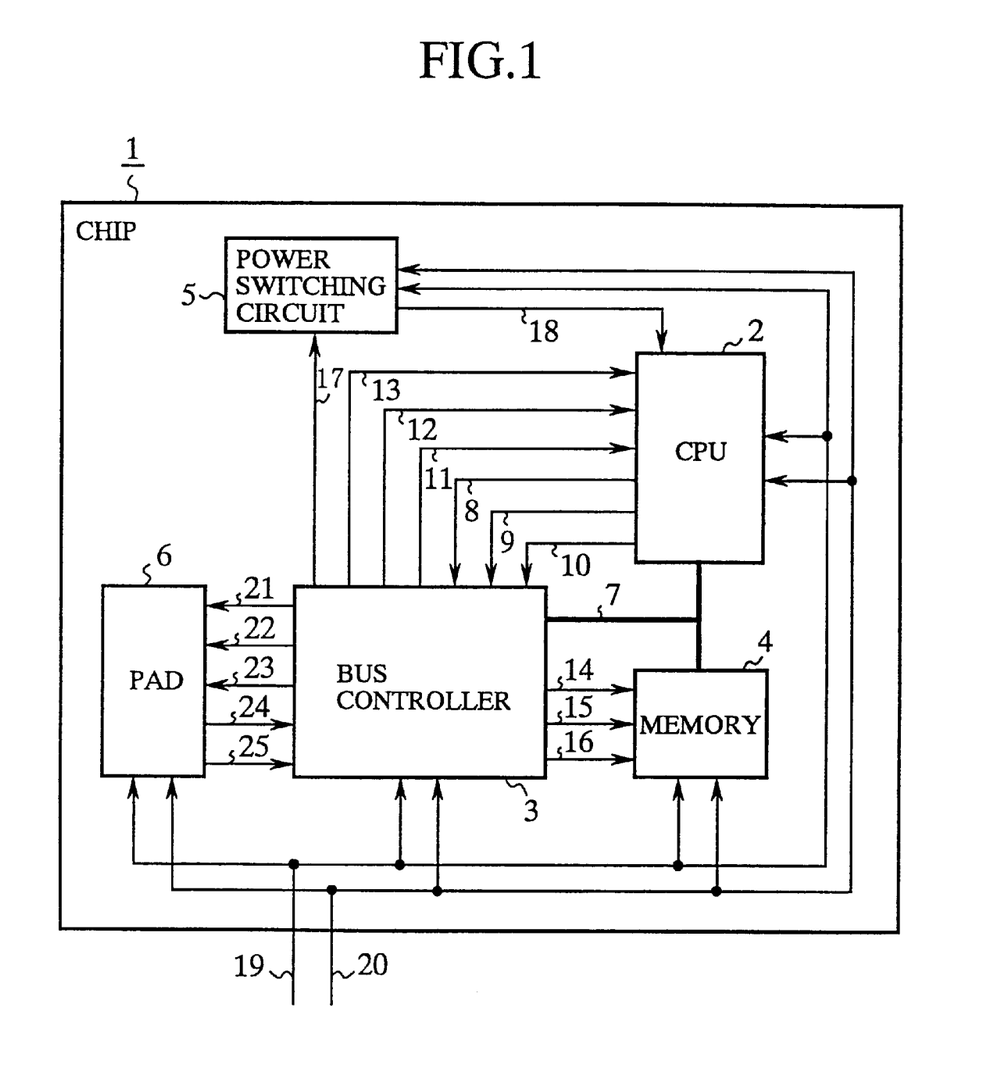
FIG. 1 is a block diagram showing an embodiment 1 of an integrated circuit device in accordance with the present invention.

FIG. 1 is a block diagram showing an embodiment 1 of an integrated circuit device in accordance with the present invention. In FIG. 1, a CPU 2, bus controller 3, memory 4, power switching circuit 5 and pad 6 are disposed on a chip 1, and the CPU 2, bus controller 3 and memory 4 are interconnected by an internal data bus 7 to carry out data transfer between them. The CPU 2 supplies the bus controller 3 with an address signal 8, read/write signal 9 and access request signal 10, and the bus controller 3 supplies the CPU 2 with an access completion signal 11, bus grant signal 12 and CPU reset signal 13, and the memory 4 with an address signal 14, read strobe signal 15 and write strobe signal 16.

The bus controller 3 further supplies the power switching circuit 5 with a power supply shutdown control signal 17, and the power switching circuit 5 supplies the CPU 2 with a power supply 18 which is halted during the powerdown.

From the outside of the chip 1, a power supply 19 and ground power supply 20 supply power to the pad 6, CPU 2, bus controller 3, memory 4 and power switching circuit 5. The power supplies 18 and 19 are positive with respect to the ground power supply 20, and are identical in a normal operation mode.

The bus controller 3 supplies the pad 6 with an external address bus signal 21, external read strobe signal 22 and external write strobe signal 23, and the pad 6 supplies the bus controller 3 with a powerdown request signal 24 and an external data signal 25.

Figure 2:
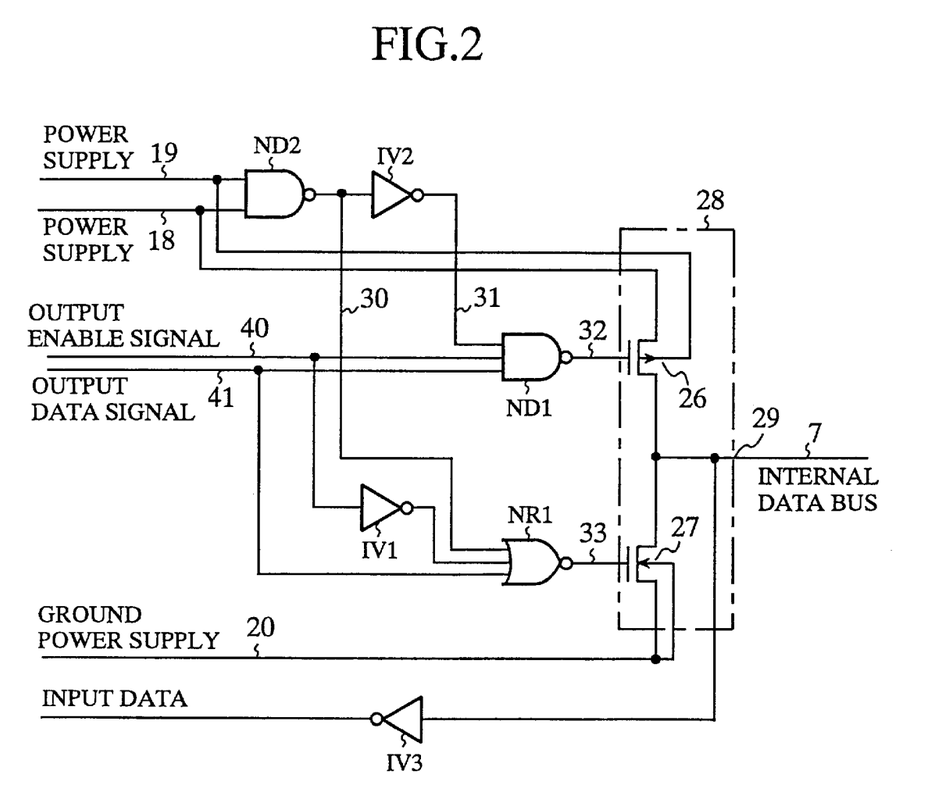
FIG. 2 is a circuit diagram showing a CMOS input/output terminal circuit in the embodiment 1.

FIG. 2 is a circuit diagram showing a CMOS input/output terminal circuit. It comprises a NAND circuit ND2 having its inputs connected to the power supplies 18 and 19, and its output connected to an inverter IV2; a NAND circuit ND1 having its input connected to the output of the inverter IV2 and to an output enable signal 40 and an output data signal 41; a P-channel MOS transistor 26 having its gate connected to the output 32 of the NAND circuit ND1, its source connected to the power supply 18, and its backgate connected to the power supply 19; a NOR circuit NR1 having its inputs connected to the output of the NAND circuit ND2, to the output enable signal 40 through an inverter IV1 and to the output data signal 41; an N-channel MOS transistor 27 having its gate connected to the output 33 of the NOR circuit NR1, its drain to the drain of the P-channel MOS transistor 26, its backgate and source to the ground power supply 20; and an inverter IV3 having its input connected to the output 29 of a CMOS tri-state driver 28. The CMOS tri-state driver 28 consists of the P-channel MOS transistor 26 and N-channel MOS transistor 27, and its output 29 is connected to the internal data bus 7 and inverter IV3 which produces the output data as input data. Here, the power supply 18 supplies power to the NOR circuit NR1, and inverters IV1 and IV3, whereas the power supply 19 supplies power to the NAND circuits ND1 and ND2, and the inverter IV2.

Next, the operation of the present embodiment 1 will be described under the headings of the normal operation mode, a powerdown mode and a reset operation of the powerdown mode.

(1) Normal Operation Mode.

First, the CPU 2 of FIG. 1 starts the data processing in response to the CPU reset signal 13 supplied from the bus controller 3. In this case, the bus controller 3 outputs "bus grant" ("H" (high) voltage, for example) as the bus grant signal 12. While the bus grant signal 12 indicative of the bus grant is being output, the CPU 2 takes control of the internal data bus 7, whereas the bus controller 3 takes control of the internal data bus 7 while the bus grant signal 12 indicative of bus inhibition is being output. In the former case, the CPU 2 outputs the address signal 8 indicating the head address of a program, and at the same time outputs the read/write signal 9 indicating "read" ("H" voltage, for example), and the access request signal 10 indicative of "request" ("H" voltage, for example).

Receiving the access request signal 10 indicating the "request", the bus controller 3 detects that an access takes place from the CPU 2. The bus controller 3 decodes the address signal 8, and makes a decision as to whether the address indicates the memory 4 in the chip 1. If the answer is positive, the bus controller 3 outputs the address signal 8 as the address signal 14, and the read strobe signal 15a indicative of "read request" ("H" voltage, for example). The address signal 8 can indicate besides the memory 4 an external memory connected to the chip 1, or a register in the bus controller 3, though only the operation when the address signal 8 points the memory 4 will be described here for the purpose of simplicity.

Receiving the read strobe signal 15 indicative of the "read request", the memory 4 reads data associated with the address signal 14, and supplies the data to the internal data bus 7. The bus controller 3 outputs the access completion signal 11 indicative of "completion" ("H" voltage, for example) at the time when the memory supplies the data to the internal data bus 7, and then outputs the read strobe signal 15 indicative of a "read relinquish" ("L" voltage, for example). Detecting the access completion signal 11 indicative of the "completion", the CPU 2 captures the program (data) from the internal data bus 7, and starts the processing. Thus, the CPU 2 sequentially reads instructions of the program from the memory 4, and executes them. When an instruction commands to read data from the memory 4, it captures the data from the internal data bus 7 in the same manner as when reading the program instructions.

In contrast, when writing data to the memory 4, the CPU 2 outputs the address signal 8 indicating the address of write data, and supplies the internal data bus 7 with the write data through the CMOS input/output terminal circuits as shown in FIG. 2. At the same time, the CPU 2 supplies the bus controller 3 with the read/write signal 9 indicative of "write" ("L" voltage, for example) and the access request signal 10 indicative of "request" ("H" voltage, for example).

Receiving the access request signal 10 indicating the "request", the bus controller 3 detects that an access takes place from the CPU 2. The bus controller 3 decodes the address signal 8, and makes a decision as to whether the address indicates the memory 4 in the chip 1. If the answer is positive, the bus controller 3 outputs the address signal 14 corresponding to the address signal 8, and the write strobe signal 16a indicative of "write request" ("H" voltage, for example). Receiving the write strobe signal 16 indicative of the "write request", the memory 4 writes the data, which is supplied through the internal data bus 7, in memory cells associated with the address signal 14. The bus controller 3 outputs the access completion signal 11 indicative of "completion" ("H" voltage, for example) at the time when the memory 4 completed the data write to the memory cells, and then outputs the write strobe signal 16 indicative of a "write relinquish" ("L" voltage, for example). Detecting the access completion signal 11 indicative of the "completion", the CPU 2 learns that the next data transfer becomes possible using the internal data bus 7.

Next, the operation when the bus controller 3 takes control of the bus will be described.

While the bus controller 3 outputs the bus grant signal 12 indicative of the "bus grant", the CPU 2 monopolizes the internal data bus 7, and the bus controller 3 does not spontaneously carry out the data transfer using the internal data bus 7.

For the bus controller 3 to take control of the internal data bus 7, it outputs the bus grant signal 12 indicative of "bus inhibition" ("L" voltage, for example). Receiving the bus grant signal 12 indicative of the "bus inhibition" from the bus controller 3, the CPU 2 outputs the output enable signal 40 of logic "L" to place the output of the CMOS input/output terminal circuits to "Z" (high-impedance state), thereby relinquishing the internal data bus 7. Thus, the CPU 2 does not drive the internal data bus 7 or supplies the bus controller 3 with the access request signal 10, even if the program under the execution instructs to read or write data from or to the memory 4. Thus, the bus controller 3 can carry out the data transfer using the internal data bus 7.

When the bus controller 3 reads data from the memory 4 through the internal data bus 7, it supplies the memory 4 with the address signal 14, and outputs the read strobe signal 15 indicative of the "read request" ("H" voltage, for example). Receiving the read strobe signal 15 indicative of the "read request", the memory 4 reads data stored in the memory cells associated with the address signal 14, and supplies it to the internal data bus 7. The bus controller 3 captures the data from the internal data bus 7, writes the data in a register of the bus controller 3, and outputs the read strobe signal 15 indicative of a "read relinquish" ("L" voltage, for example).

When writing data to the memory 4, the bus controller 3 supplies the memory 4 with the address signal 14 and the data in its register, and outputs the write strobe signal 16 indicative of a "write request" ("H" voltage, for example). Receiving the write strobe signal 16 indicative of the "write request", the memory 4 writes the data supplied through the internal data bus 7 in the memory cells associated with the address signal 14. The bus controller 3 causes the access completion signal 11 to generate an interrupt at the time when the memory 4 completes the data write to the memory cells, and then outputs the write strobe signal 16 indicative of the "write relinquish" ("L" voltage, for example).

(2) Operation in the Powerdown Mode.

The powerdown mode is started when the pad 6 supplies the bus controller 3 with the powerdown request signal 24 indicative of a "powerdown request" ("H" voltage, for example). Detecting the powerdown request signal 24 indicative of the "powerdown request", the bus controller 3 supplies the power switching circuit 5 with the power supply shutdown control signal 17 indicative of "disconnection" ("H" voltage, for example). Receiving the power supply shutdown control signal 17 indicative of the "disconnection", the power switching circuit 5 interrupts the supply from the power supply 18, after which the input/output terminal circuit of the CPU 2 operates as follows.

When the power supply 18 is shut off, the NAND circuit ND2 of FIG. 2 supplies the powerdown control line 30 with logic "H" (the voltage of the power supply 19), and the inverter IV2 supplies the powerdown control line 31 with logic "L" by inverting the signal on the powerdown control line 30. Here, the powerdown control lines 30 and 31 are connected to the NAND circuit ND1 and NOR circuit NR1, respectively. Accordingly, the NAND circuit ND1 produces logic "H" from its output 32 and the NOR circuit NR1 produces logic "L" from its output 33 independently of the levels of the output enable signal 40 and output data signal 41.

Thus, the P-channel MOS transistor 26 is placed at the non-conducting state with its gate and backgate maintained at logic "H" (the voltage of the power supply 19). At the same time, the N-channel MOS transistor 27 is also placed at the non-conducting state with its gate, backgate and source maintained at logic "L" (ground voltage). Thus, the outputs of the input/output terminal circuits of the CPU 2 are maintained at "Z" (high-impedance state) during the powerdown mode. This can positively prevent the current, which originates from any other input/output terminal circuit connected together to the line of the internal data bus 7, from flowing through the P-channel MOS transistor 26 into the power supply 18 regardless of whether the memory 4 or bus controller 3 drives the internal data bus 7 to logic "H" or "L".

Thus, the CPU 2 places the internal data bus 7 at the high-impedance state "Z" through the input/output terminal circuits independently of the internal state of the CPU 2. In the CPU 2, all the internal circuits except for the input/output terminal circuits are disconnected from the power supply 18, so that the power consumption in the CPU 2 is limited to that due to minimum leakage current in the input/output terminal circuits. The bus controller 3 can carry out the read/write operation to the memory 4 as in the normal operation mode.

(3) Reset Operation of the Powerdown Mode.

Reset of the powerdown mode is started when the pad 6 supplies the bus controller 3 with the powerdown request signal 24 indicative of "powerdown relinquish" ("L" voltage, for example). Receiving the powerdown request signal 24 indicative of the "powerdown relinquish", the bus controller 3 supplies the power switching circuit 5 with the power supply shutdown control signal 17 indicative of "connection" ("L" voltage, for example). Receiving the power supply shutdown control signal 17 indicating "connection", the power switching circuit 5 starts supplying power from the power supply 18. Since the CPU 2 does not keep its internal state in the powerdown mode, the bus controller 3 supplies the CPU 2 with the CPU reset signal 13 and the bus grant signal 12 indicative of "bus grant". Receiving the CPU reset signal 13 and being supplied with the power of the power supply 18, the CPU 2 is returned from the powerdown mode to the normal operation mode, and starts the data processing.

As described above, the integrated circuit device in accordance with the present invention is provided with the CMOS tri-state drivers which can positively maintain the bus at the high-impedance state "Z", that is, at the electrically open state. This enables any circuit which is not powered down to carry out data transfer without any extra power consumption, thereby making power saving possible.

EMBODIMENT 2

Figure 3:
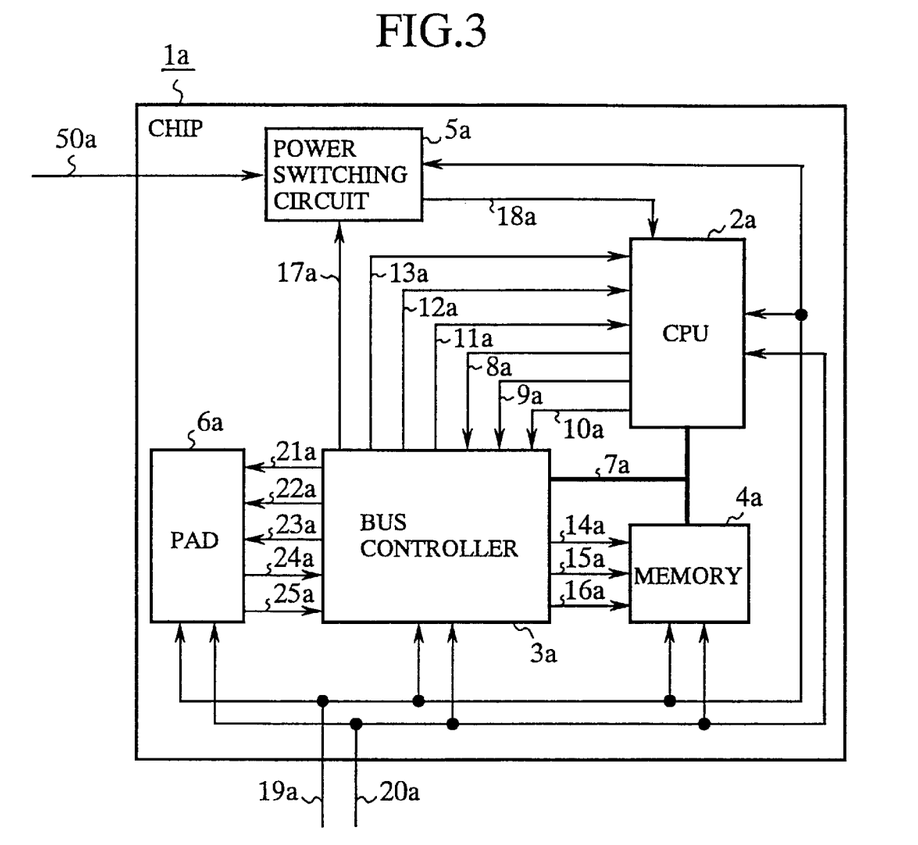
FIG. 3 is a block diagram showing an embodiment 2 of the integrated circuit device in accordance with the present invention.

FIG. 3 is a block diagram showing an embodiment 2 of an integrated circuit device in accordance with the present invention. Although the fundamental operation of the integrated circuit device is the same as that of FIG. 1, the operation voltage of internal circuits of the CPU 2a is set lower than that of the other circuits. In FIG. 3, the reference numeral 1a designates a chip. The chip 1a comprises a CPU 2a, bus controller 3a, memory 4a, power switching circuit 5a and pad 6a, which are disposed on the chip 1a. The CPU 2a, bus controller 3a and memory 4a are interconnected by an internal data bus 7a to carry out data transfer between them. The CPU 2a supplies the bus controller 3a with an address signal 8a, read/write signal 9a and access request signal 10a, whereas the bus controller 3a supplies the CPU 2a with an access completion signal 11a, bus grant signal 12a and CPU reset signal 13a, and the memory 4a with an address signal 14a, read strobe signal 15a and write strobe signal 16a.

The bus controller 3a further supplies the power switching circuit 5a with a power supply shutdown control signal 17a, and the power switching circuit 5a supplies the CPU 2a with power from a power supply 18a which is shut off during the powerdown.

From the outside of the chip 1a, power supplies 50a and 19a and a ground power supply 20a supply power to the pad 6a, CPU 2a, bus controller 3a, memory 4a and power switching circuit 5a. The power supplies 50a and 19a are positive with respect to the ground power supply 20, and the voltage of the power supply 50a is lower than that of the power supply 19a.

The bus controller 3a supplies the pad 6a with an external address bus 21a, external read strobe signal 22a and external write strobe signal 23a, whereas the pad 6a supplies the bus controller 3a with a powerdown request signal 24a and an external data signal 25a.

Figure 4:
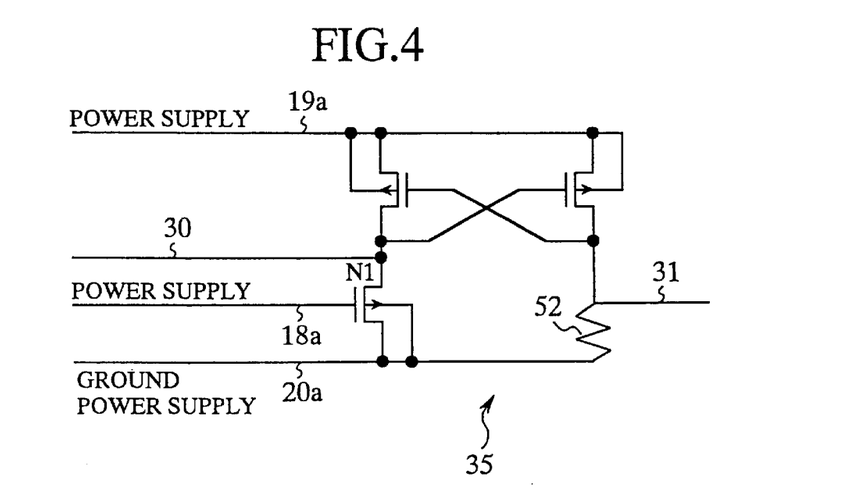
FIG. 4 is a circuit diagram showing a potential difference detector 35 of the embodiment 2.

FIG. 4 is a circuit diagram showing a potential difference detector 35 for detecting the shutdown of the power from the power supply 18a to the CPU 2a. By adjusting a resistor 52, the potential difference detector 35 can be set such that it supplies the power down control lines 30 and 31 with logic "L" and "H", respectively, in the normal operation mode, whereas with logic "H" and "L", respectively, in the powerdown mode in which the power supply 18a is shut off, thereby detecting the shutdown of the power supply 18a.

Figure 5:
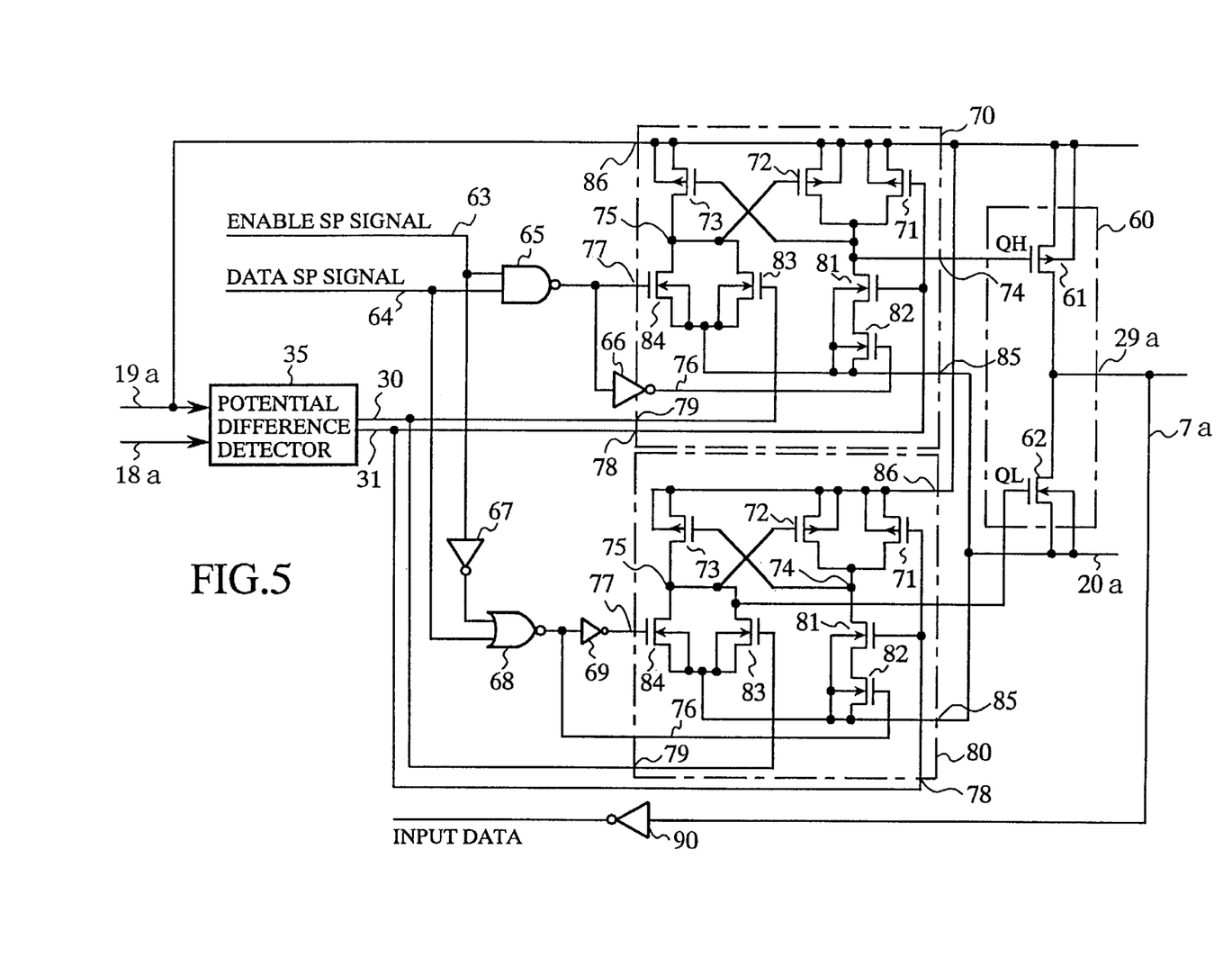
FIG. 5 is a circuit diagram showing an input/output terminal circuit of the embodiment 2.

FIG. 5 shows an input/output terminal circuit of the CPU 2a, which includes a CMOS level converter. The input/output terminal circuit comprises a NAND circuit 65 to which an enable signal 63 and a data signal 64 are input; a CMOS level converter 70 which is supplied with the output of the NAND circuit 65 and its inverted signal through an inverter 66; a P-channel MOS transistor 61 with its gate connected to the output QH of the CMOS level converter 70, its source and backgate connected to the power supply 19a; a NOR circuit 68 which is supplied with the data signal 64 and the enable signal through an inverter 67; a CMOS level converter 80 which is supplied with the output of the NOR circuit 68 and its inverted signal through an inverter 69; and an N-channel MOS transistor 62 with its gate connected to the CMOS level converter 80, its drain connected to the drain of the P-channel MOS transistor 61, and its source and backgate connected to the ground power supply 20a. The P-channel MOS transistor 61 and N-channel MOS transistor 62 constitute a CMOS tri-state driver 60 whose output data is supplied to the internal data bus 7a, and to the CPU 2a through an inverter 90 as the input data.

The CMOS level converter 70 and 80 each comprise a first power supply terminal 85 to which a first fixed potential (ground power supply) 20a is supplied; a second power supply terminal 86 to which a second fixed potential 19a is supplied; a first data input terminal 76; a second data input terminal 77; a first output terminal 74; a second output terminal 75; a first mode control input terminal 78; a second mode control input terminal 79; a first P-channel MOS transistor 71 having its source connected to the second power supply terminal 86, its drain connected to the first output terminal 74, and its gate connected to the first mode control input terminal 78; a second P-channel MOS transistor 72 having its source connected to the second power supply terminal 86, its drain connected to the first output terminal 74, and its gate connected to the second output terminal 75; a third P-channel MOS transistor 73 having its source connected to the second power supply terminal 86, its drain connected to the second output terminal 75 and its gate connected to the first output terminal 74; a first N-channel MOS transistor 81 having its drain connected to the first output terminal 74, and its gate connected to the first mode control input terminal 78; a second N-channel MOS transistor 82 having its source connected to the first power supply terminal 85, its drain connected to a source of the first N-channel MOS transistor 81, and its gate connected to the first data input terminal 76; a third N-channel MOS transistor 83 having its source connected to the first power supply terminal 85, its drain connected to the second output terminal 75, and its gate connected to the second mode control input terminal 79; and a fourth N-channel MOS transistor 84 having its source connected to the first power supply terminal 85, its drain connected to the second output terminal 75, and its gate connected to the second data input terminal 77.

Next, the operation of the present embodiment 2 will be described.

In the normal mode operation, the potential difference detector 35 supplies the powerdown control lines 30 and 31 with logic "L" and "H", respectively. Thus, the P-channel MOS transistor 71 and N-channel MOS transistor 83 are brought out of conduction, whereas the N-channel MOS transistor 81 is brought into conduction, and hence the CMOS level converter 70 becomes just as the conventional CMOS level converter as shown in FIG. 9, and operates likewise.

In contrast, in the powerdown mode, the potential difference detector 35 supplies the powerdown control lines 30 and 31 with logic "H" and "L", respectively. This brings the N-channel MOS transistor 83 into conduction, and hence brings the P-channel MOS transistor 72 into conduction. Accordingly, the output QH of the CMOS level converter 70 is maintained at logic "H", whereas the output of QL of the CMOS level converter 80 is held at logic "L". Thus, both the P-channel MOS transistor 61 and N-channel MOS transistor 62 of the CMOS tri-state driver 60 are brought out of conduction regardless of the state of the enable signal 63 and data signal 64, thereby maintaining the high-impedance state "Z".

As described above, the integrated circuit device in accordance with the present invention is provided with the CMOS level converters that can positively maintain the outputs of the CMOS tri-state drivers which are connected to the bus at the high-impedance state "Z", that is, at the electrically open state. This makes it possible for the circuit which is not powered down to carry out data transfer without any extra power consumption, thereby enabling power saving.

What is claimed is:

1. An integrated circuit device comprising:

a first power supply terminal to which a first fixed potential is supplied;

a second power supply terminal to which a second fixed potential is supplied, a third power supply terminal to which a third fixed potential that can be powered down is supplied;

an output terminal;

a first conductivity type MOS transistor having its source connected to said third power supply terminal, its backgate connected to said second power supply terminal, and its drain connected to said output terminal;

a second conductivity type MOS transistor having its drain connected to said output terminal, and its backgate and source connected to said first power supply terminal;

a potential difference detector connected to said second power supply terminal and said third power supply terminal for detecting a potential difference between them, and a gate potential controller connected to said potential difference detector for controlling a potential of the gate of said first conductivity type MOS transistor in response to an output of said potential difference detector.

2. The integrated circuit device as claimed in claim 1, wherein said gate potential controller controls a potential of a gate of said second conductivity type MOS transistor in response to the output of said potential difference detector.

3. An integrated circuit device comprising:

a first power supply terminal to which a first fixed potential is supplied;

a second power supply terminal to which a second fixed potential is supplied;

a tri-state driver including a first conductivity type MOS transistor that has a source and a backgate which are isolated from each other and has said backgate connected to said second power supply terminal, and a second conductivity type MOS transistor that has its drain connected to a drain of said first conductivity type MOS transistor and its source connected to said first power supply terminal;

a switching circuit for connecting or disconnecting said source of said first conductivity type MOS transistor with said second power supply terminal;

a gate potential controller for controlling a potential of a gate of said first conductivity type MOS transistor; and a power supply controller for controlling said switching circuit and said gate potential controller, wherein said integrated circuit device is partitioned into a first block including said tri-state driver, and a second block including said power supply controller, and wherein said switching circuit disconnects, when said power supply controller powers down said first block, said source of said first conductivity type MOS transistor from said second power supply terminal, and said gate potential controller supplies the gate of said second conductivity type MOS transistor with a potential equal to the potential of said second power supply terminal.

* * * * *